US010879320B2

(12) United States Patent
Zhu et al.

(10) Patent No.: US 10,879,320 B2
(45) Date of Patent: Dec. 29, 2020

(54) ORGANIC LIGHT-EMITTING DISPLAY PANEL AND DISPLAY APPARATUS

(71) Applicant: Shanghai Tianma AM-OLED Co., Ltd., Shanghai (CN)

(72) Inventors: Pengjuan Zhu, Shanghai (CN); Zhiyong Xiong, Shanghai (CN); Xu Lu, Shanghai (CN)

(73) Assignee: Shanghai Tianma AM-OLED Co., Ltd., Shanghai (CN)

(*) Notice: Subject to any disclaimer, the term of this patent is extended or adjusted under 35 U.S.C. 154(b) by 0 days.

(21) Appl. No.: 16/573,945

(22) Filed: Sep. 17, 2019

(65) Prior Publication Data

US 2020/0350375 A1 Nov. 5, 2020

(30) Foreign Application Priority Data

Apr. 30, 2019 (CN) .......................... 2019 1 0363589

(51) Int. Cl.
*G09G 5/00* (2006.01)
*H01L 27/32* (2006.01)
(Continued)

(52) U.S. Cl.
CPC ........ *H01L 27/3234* (2013.01); *G06K 9/0004* (2013.01); *H01L 27/3211* (2013.01);
(Continued)

(58) Field of Classification Search
CPC ............. H01L 27/3234; H01L 27/3211; H01L 27/3262; H01L 27/3276; H01L 51/5218;
(Continued)

(56) References Cited

U.S. PATENT DOCUMENTS 10,163,984 B1* 12/2018 Ho ...................... H01L 27/3216
2018/0005007 A1* 1/2018 Du ......................... G09G 3/3225
(Continued)

FOREIGN PATENT DOCUMENTS

CN 107819018 A 3/2018
CN 108287428 A 7/2018
(Continued)

OTHER PUBLICATIONS

First Chinese Office Action, dated Sep. 4, 2020, issued in corresponding Chinese Application No. 201910363589.4, filed Apr. 30, 2019, 12 pages.

*Primary Examiner* — Jennifer T Nguyen
(74) *Attorney, Agent, or Firm* — Christensen O'Connor Johnson Kindness PLLC (57) ABSTRACT

An organic light-emitting display panel has a display region including a fingerprint recognition region and light-emitting devices for displaying image, the display panel includes a driving device layer, an anode layer, a pixel definition layer, an organic light-emitting layer, and a cathode layer sequentially stacked; and an optical fingerprint recognition sensor located in the fingerprint recognition region and located at a side of the driving device layer away from the anode layer; the pixel definition layer includes sub-pixel openings corresponding to the light-emitting devices, each light-emitting device includes an anode corresponding to one sub-pixel opening, the anode being located in the anode layer and overlapping with a corresponding sub-pixel opening, the organic light-emitting layer is located in each sub-pixel opening, and the cathode layer overlaps with each sub-pixel opening; in the fingerprint recognition region, at least part of the light-emitting devices each have an anode being a transparent electrode.

18 Claims, 7 Drawing Sheets

(51) Int. Cl.
*G06K 9/00* (2006.01)
*H01L 51/52* (2006.01)
*H01L 27/12* (2006.01)

(52) U.S. Cl.
CPC ...... *H01L 27/3262* (2013.01); *H01L 27/3276* (2013.01); *H01L 51/5218* (2013.01); *H01L 27/1214* (2013.01); *H01L 2251/306* (2013.01); *H01L 2251/308* (2013.01)

(58) Field of Classification Search
CPC ........... H01L 27/1214; H01L 2251/306; H01L 2251/308; H01L 51/448; H01L 27/3244; G06K 9/0004; G06F 3/042; G06F 3/0421
USPC .................................................. 345/156, 175
See application file for complete search history.

(56) References Cited

U.S. PATENT DOCUMENTS

| | | | | |
|---|---|---|---|---|
| 2019/0362672 A1* | 11/2019 | Cui | ...................... | H01L 27/3262 |
| 2019/0384960 A1* | 12/2019 | Kwon | ...................... | G06F 3/041 |
| 2020/0168673 A1* | 5/2020 | Manders | ............... | H01L 51/502 |

FOREIGN PATENT DOCUMENTS

| | | | |
|---|---|---|---|
| CN | 109037296 A | 12/2018 | |
| CN | 109509767 A | 3/2019 | |

* cited by examiner

ORGANIC LIGHT-EMITTING DISPLAY PANEL AND DISPLAY APPARATUS

CROSS-REFERENCE TO RELATED APPLICATIONS

The present application claims priority to Chinese Patent Application No. 201910363589.4, filed on Apr. 30, 2019, the content of which is incorporated herein by reference in its entirety.

TECHNICAL FIELD

The present disclosure relates to the field of display technologies and, particularly, to an organic light-emitting display panel and a display apparatus.

BACKGROUND

With the development of display technology, the organic light-emitting display (OLED) panel has more and more applications due to its excellent characteristics such as self-luminosity, high brightness, wide viewing angle and fast response. In order to realize the fingerprint recognition function, a fingerprint recognition sensor is arranged in the border region of the organic light-emitting display panel to form a fingerprint recognition region, so that a fingerprint recognition function is realized in the fingerprint recognition region. However, since a considerable area of fingerprint recognition region is required to recognize the fingerprint, an area of the border region needed for the fingerprint recognition is relatively large.

SUMMARY

The present disclosure provides an organic light-emitting display panel and a display apparatus, which can realize a fingerprint recognition function in a display region and facilitate the design of a narrow border.

In a first aspect of the present disclosure, an organic light-emitting display panel is provided. The organic light-emitting display panel includes a display region, the display region including a fingerprint recognition region and a plurality of light-emitting devices for displaying an image. The organic light-emitting display panel includes: a driving device layer, an anode layer, a pixel definition layer, an organic light-emitting layer, and a cathode layer which are sequentially stacked; and an optical fingerprint recognition sensor located in the fingerprint recognition region and located at a side of the driving device layer facing away from the anode layer. The pixel definition layer includes a plurality of sub-pixel openings corresponding to the plurality of light-emitting devices, each of the plurality of light-emitting device includes an anode corresponding to one of the plurality of sub-pixel openings, the anode being located in the anode layer and overlapping with a corresponding one of the plurality of sub-pixel openings, the organic light-emitting layer is located in each of the plurality of sub-pixel openings, and the cathode layer overlaps with each of the plurality of sub-pixel openings. In the fingerprint recognition region, at least a part of the plurality of light-emitting devices each have an anode that is a transparent electrode.

In a second aspect of the present disclosure, a display apparatus is provided. The display apparatus includes the organic light-emitting display panel as disclosed in any embodiment of the present disclosure.

BRIEF DESCRIPTION OF DRAWINGS

In order to better explain embodiments of the present disclosure or the technical solution in the related art, the drawings to be used in the description of the embodiments or the related art will be briefly described below. It is appreciated that, the drawings in the following description are only a part of the embodiments of the present disclosure. For those skilled in the art, other embodiments may also be obtained based on these drawings.

DESCRIPTION OF EMBODIMENTS

In order to better illustrate objects, technical solutions and advantages of embodiments of the present disclosure, the technical solutions in the embodiments of the present disclosure are clearly and completely described below with reference to the accompanying drawings in the embodiments of the present disclosure. It is appreciated that the described embodiments are merely part of the embodiments of the present disclosure rather than all of the embodiments. All other embodiments obtained by those skilled in the art shall fall into the protection scope of the present disclosure.

The terms used in the embodiments of the present disclosure are merely for the purpose of describing specific embodiments, rather than limiting the present disclosure. The terms "a", "an", "the" and "said" in a singular form in the embodiments of the present disclosure and the appended claims are also intended to include plural forms thereof, unless noted otherwise.

Figure 1:
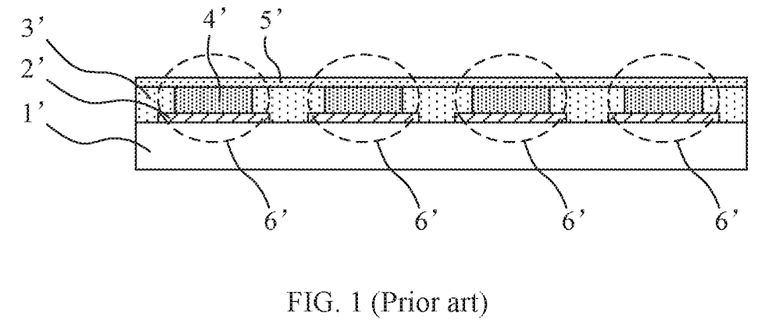
FIG. 1 is a cross-sectional structural schematic diagram showing a portion of an organic light-emitting display panel in the related art.

The inventors have found in the related art research that, as shown in FIG. 1, FIG. 1 is a cross-sectional structural schematic diagram showing a portion of an organic light-emitting display panel in the related art. An organic light-emitting display panel includes a driving device layer 1', an anode layer 2', a pixel definition layer 3', an organic light-emitting layer 4', and a cathode layer 5' which are sequentially stacked. The driving device layer 1' is provided with a pixel driving circuit for driving the light-emitting device to emit light, in order to realize a display function. The pixel definition layer 3' has a plurality of openings thereon. One light-emitting device 6' is formed at each of the openings. The light-emitting device 6' is formed by an anode layer 2', an organic light-emitting layer 4' and a cathode layer 5' at the opening. The cathode layer 5' is made of a transparent material or a transflective material (i.e., a material that is capable of both transmission and reflection). The anode layer 2' is made of a total reflection material such as metal. The light emitted by the organic light-emitting layer 4' is reflected at the anode layer 2' and exits at a side of the cathode layer 5', that is, a side of the layer 5' away from the anode layer 2' is a light-out side of the organic light-emitting display panel. If the fingerprint recognition function is to be realized in the display region, the fingerprint recognition sensor may be arranged at a side of the light-emitting device layer 1' facing away from the cathode layer 5'. In this way, when a user's finger is placed on the light-emitting side of the organic light-emitting display panel, the light emitted by the organic light-emitting layer 4' is reflected at the finger, and the reflected light is sensed at the fingerprint recognition sensor so as to perform fingerprint recognition according to the reflected light. However, since the anode layer 2' is opaque, only a small amount of light reflected at the finger can reach the fingerprint recognition sensor, resulting in a poor fingerprint recognition function. The inventors have therefore made the present disclosure, and embodiments of the present disclosure are described as follows.

Figure 2:
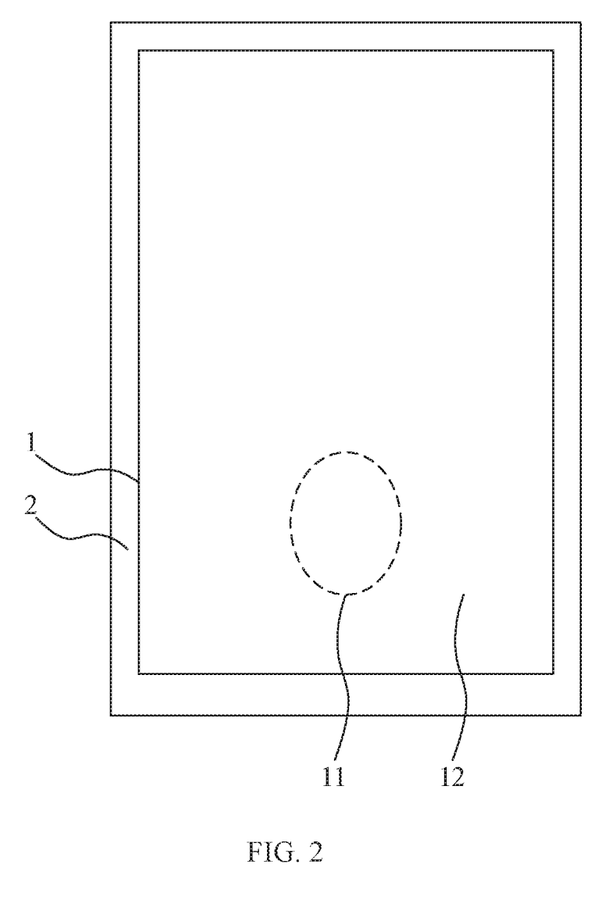
FIG. 2 is a structural schematic diagram showing an organic light-emitting display panel according to an embodiment of the present disclosure.
Figure 3:
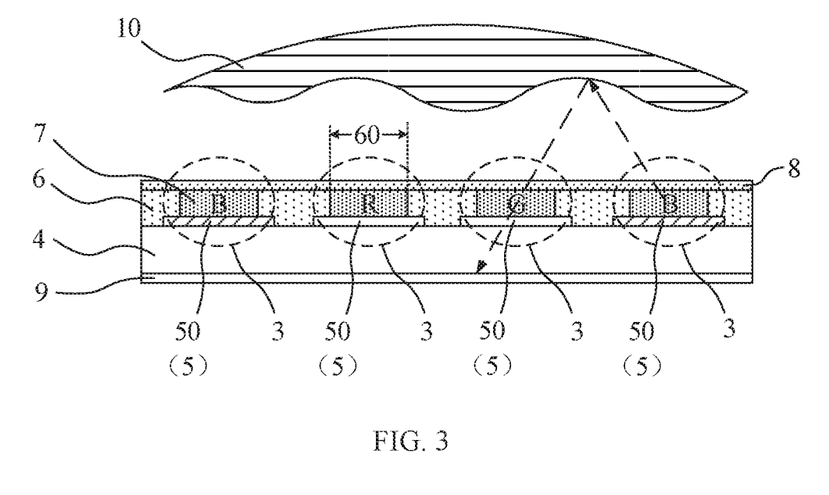
FIG. 3 is a cross-sectional structural schematic diagram showing a portion of a fingerprint recognition region in FIG. 2.

As shown in FIGS. 2-3, FIG. 2 is a structural schematic diagram showing an organic light-emitting display panel according to an embodiment of the present disclosure, and FIG. 3 is a cross-sectional structural schematic diagram showing a portion of the fingerprint recognition region in FIG. 2. According to an embodiment, an organic light-emitting display panel is provided. The organic light-emitting display panel includes: a display region 1 and a non-display region 2. The display region 1 includes a fingerprint recognition region 11 and a non-fingerprint-recognition region 12. The display region 1 is configured to implement an image display function. The non-display region 2 surrounding the display region 1 is configured to set devices such as peripheral circuits and the like. The fingerprint recognition region 11 is a region for implementing the fingerprint recognition function that can also be used for implementing the function of image display. The non-fingerprint-recognition region 12 is only used to implement the image display function. It can be understood that, in other possible embodiments, the entire display region may be set as a fingerprint recognition region, that is, the fingerprint recognition function may be implemented at any position of the display region. The display region 1 includes a plurality of light-emitting devices 3 for displaying an image. The organic light-emitting display panel includes a driving device layer 4, an anode layer 5, a pixel definition layer 6, an organic light-emitting layer 7 and a cathode layer 8 which are sequentially stacked. The pixel definition layer 6 includes a plurality of sub-pixel openings 60 corresponding to the plurality of light-emitting devices 3. Each of the light-emitting devices 3 includes an anode 50 corresponding to each of the sub-pixel openings 60. Each anode 50 is located at the anode layer 5 and overlaps with the corresponding sub-pixel opening 60. The organic light-emitting layer 7 is located in each of the sub-pixel openings 60. The cathode layer 8 overlaps with each of the sub-pixel openings 60. The light-emitting device 3 further includes an organic light-emitting layer 7 and a cathode layer 8. For each of the plurality of sub-pixel openings 60, the anode 50, the organic light-emitting layer 7, and the cathode layer 8 collectively constitute a light-emitting device 3, i.e., an organic light-emitting diode. The sub-pixel opening 60 is a hollow region in the pixel definition layer 6 and configured to define a light-emitting region corresponding to each sub-pixel, so that the light-emitting device 3 emits light in the sub-pixel opening 60 to realize display of one sub-pixel. The plurality of sub-pixels in the entire display region 1 operate together to form a display image. The anodes 50 of the respective light-emitting devices 3 are mutually independent. The cathode layer 8 may be a continuous structure of the entire surface. The driving device layer 4 is provided with a pixel driving circuit for supplying a voltage to the anode 50 of the corresponding light-emitting device 3. A voltage is applied to the anode 50 and the cathode layer 8, respectively. Under the action of the voltage, holes and electrons are injected into the organic light-emitting layer 7 to be combined in the organic light-emitting layer 7, thereby releasing energy to realize light emission. The organic light-emitting display panel further includes an optical fingerprint recognition sensor 9 in fingerprint recognition region 11. The optical fingerprint recognition sensor 9 is located at a side of the driving device layer 4 facing away from the anode layer 5, and is configured to sense the light. In the fingerprint recognition region 11, the anodes 50 of at least a part of the light-emitting devices 3 are transparent electrodes.

In FIG. 3, the anodes 50 shown without shadow lines are transparent electrodes, and the anodes 50 shown with shadow lines are reflective electrodes. In an embodiment of the present disclosure, the anodes 50 of a part of light-emitting devices 3 in the fingerprint recognition region 11 are transparent electrodes, and the anodes of the other part of the light-emitting devices 3 are reflective electrodes. It is appreciated that, in other possible embodiments, the anodes 50 of all of the light-emitting devices 3 in the fingerprint-recognition region 11 may be arranged as transparent electrodes. When fingerprint recognition is performed, the light generated by the organic light-emitting layer 7 is reflected at the user's finger 10, and the reflected light can be transmitted to the optical fingerprint recognition sensor 9 through the transparent anode 50, thereby realizing fingerprint recognition. Meanwhile, for the light-emitting device 3 having the transparent anode 50, the light generated by the corresponding organic light-emitting layer 7 can still be emitted through the cathode layer 8 to achieve a normal light-emitting function. In FIG. 3, a dotted arrow points to a propagation direction of the light. The optical fingerprint recognition sensor 9 is a sensor that performs fingerprint recognition by sensing light. In an embodiment of the present disclosure, the specific structure of the optical fingerprint recognition sensor 9 is not limited. For example, in FIG. 3, the optical fingerprint recognition sensor 9 is a continuous structure of an entire surface. In other possible embodiments, the optical fingerprint recognition sensor 9 may be provided with a plurality of independent optical fingerprint recognition sensors in the fingerprint recognition region.

In the organic light-emitting display panel according to the embodiments of the disclosure, the optical fingerprint recognition sensor is arranged in the fingerprint recognition region of the display region, while the anodes of at least part of the light-emitting devices in the fingerprint recognition region are set as transparent electrodes, so that the light used for recognizing the fingerprint can be transmitted to the optical fingerprint recognition sensor, thereby realizing the fingerprint recognition function in the display region, which facilitates the design of the narrow border. Compared with the anodes of all light-emitting devices being the reflective electrodes in the related art, when the fingerprint recognition function of the display region is realized, the optical fingerprint recognition sensor can receive more light for recognizing the fingerprint, and therefore, the accuracy of fingerprint recognition is higher.

Figure 4:
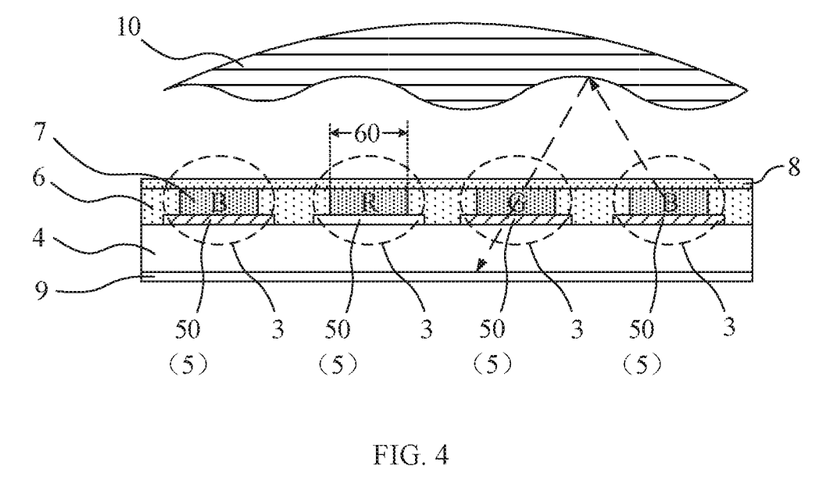
FIG. 4 is another cross-sectional structural schematic diagram showing a portion of the fingerprint recognition region in FIG. 2.
Figure 5:
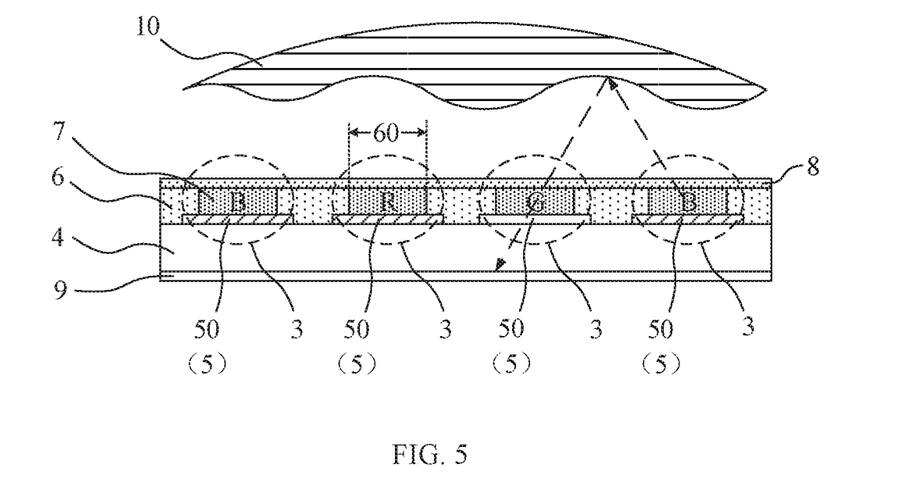
FIG. 5 is another cross-sectional structural schematic diagram showing a portion of the fingerprint recognition region in FIG. 2.

In an embodiment, as shown in FIGS. 2-5, FIG. 4 is another cross-sectional structural schematic diagram showing a portion of the fingerprint recognition region in FIG. 2, and FIG. 5 is another cross-sectional structural schematic diagram showing a portion of the fingerprint recognition region in FIG. 2. In the fingerprint recognition region, the light-emitting device 3 includes a red light-emitting device R, a green light-emitting device G, and a blue light-emitting device B. The red light-emitting device R and/or the green light-emitting device G are/is transparent light-emitting device(s). In particular, the anode 50 of the transparent light-emitting device is a transparent electrode. The blue light-emitting device B is a non-transparent light-emitting device. The anode of the non-transparent light-emitting device is a reflective electrode which is a non-transparent electrode. The transparent light-emitting device (i.e., the anode 50) is a light-emitting device having a transparent electrode. The non-transparent light-emitting device (i.e., the anode 50) is a light-emitting device having a reflective electrode. FIG. 3 illustrates that the red light-emitting device R and the green light-emitting device G are both transparent light-emitting devices, and the blue light-emitting device B is a non-transparent light-emitting device. FIG. 4 illustrates that the red light-emitting device R is a transparent light-emitting device, and the blue light-emitting device B and the green light-emitting device G are both non-transparent light-emitting devices, that is, the anode 50 of the green light-emitting device G and the anode 50 of the blue light-emitting device B are both reflective electrodes. FIG. 5 illustrates that the green light-emitting device G is a transparent light-emitting device, and the blue light-emitting device B and the red light-emitting device R are both non-transparent light-emitting devices, that is, the anode 50 of the red light-emitting device R and the anode 50 of the blue light-emitting device B are both reflective electrodes.

Each of the light-emitting devices 3 corresponds to one sub-pixel. The red light-emitting device R is a light-emitting device for emitting red light, corresponding to a red sub-pixel. The green light-emitting device G is a light-emitting device for emitting green light, corresponding to a green sub-pixel. The blue light-emitting device B is a light-emitting device for emitting blue light, corresponding to a blue sub-pixel. Three sub-pixels having different colors can form one pixel. Display of a color pixel is realized by a combination of different colors. For the light-emitting devices of different colors, it depends on the material of the organic light-emitting layer 7, each of the red light-emitting device R, the green light-emitting device G and the blue light-emitting device B has corresponding material of the organic light-emitting layer 7, so that the light-emitting device 3 can emit light having different colors. For the light-emitting devices 3 corresponding to the sub-pixels of different colors, the respective luminous efficiencies are different, that is, under control of the same driving current, the brightness of the generated light is different. For example, the brightness of the red light-emitting device R and the brightness of the green light-emitting device G are greater than that of the blue light-emitting device B. Therefore, on the one hand, the transparency of the anodes 50 is considered to increase the light transmittance of the anode layer 5 so that more light can pass through the anode layer 5 to improve the fingerprint recognition effect. Thus the anode 50 of at least one of the red light-emitting device R and the green light-emitting devices G is a transparent electrode, that is, the brightness of the red light-emitting device R or of the green light-emitting device G are lowered, which has little influence on the display effect of the image. On the other hand, when the power consumption and the lifetime of the light-emitting device 3 are considered, the anode 50 of the blue light-emitting device B may be set as a reflective electrode. In this way, in the blue light-emitting device B, the light generated by the organic light-emitting layer 7 can be reflected by the anode 50 to increase the brightness of the blue sub-pixel. In addition, when the material of the cathode layer 8 corresponding to the blue sub-pixel is a transflective material, a micro-cavity effect may be generated by cooperating with the total reflection of the anode 50 so as to further improve the brightness of the blue light-emitting device B. In this way, it may not be necessary to provide a higher drive current to the blue light-emitting device B to meet the corresponding image display effect, thus power consumption is reduced. In an embodiment of the present disclosure, if the blue light-emitting device B and the sub-pixels having the other two colors are operated under different driving currents for a long time, the lifetime of the organic light-emitting layer 7 of the blue light-emitting device B may be reduced compared to the light-emitting devices having the other two colors, resulting in a difference in brightness between the light-emitting devices having different colors as the working time of the organic light-emitting display panel increases, and thereby adversely affecting the display effect. In an embodiment of the present disclosure, the anode 50 of at least one of the red light-emitting device R and the green light-emitting device G is set as a transparent electrode, and the anode 50 of the blue light-emitting device B is a reflective electrode. As a result, the driving current of the blue light-emitting device B tends to be consistent with that of the light-emitting devices having the other two colors when an image is displayed, thereby solving the problem of the lifetime of the organic light-emitting layer 7 of the blue light-emitting device B being more severely attenuated. Additionally the problem that a probability of a difference in brightness between the blue light-emitting device B and other color light-emitting device increases with the working time of the organic light-emitting display panel is also solved.

Figure 6:
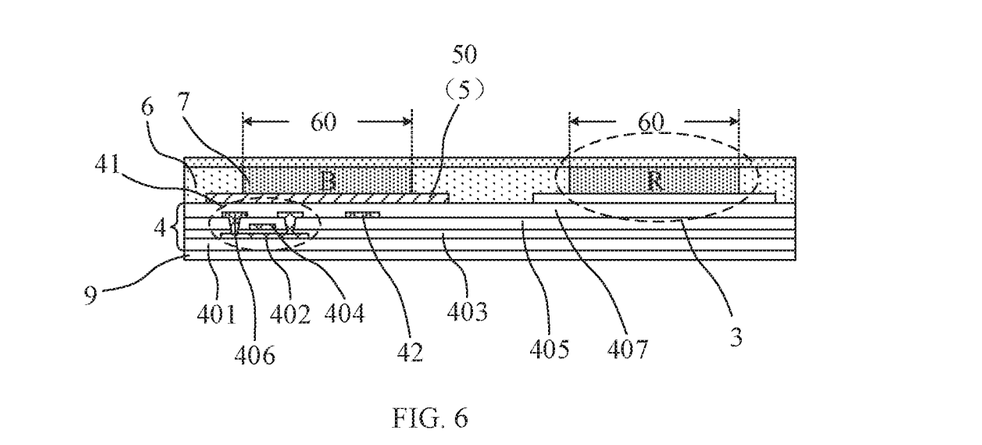
FIG. 6 is another cross-sectional structural schematic diagram showing a portion of the fingerprint recognition region in FIG. 2.

In an embodiment, as shown in FIG. 6, FIG. 6 is another cross-sectional structural schematic diagram showing a portion of the fingerprint recognition region in FIG. 2. The driving device layer 4 includes a thin film transistor 41. In a direction perpendicular to a plane where the organic light-emitting display panel is located, the thin film transistor 41 does not overlap with the sub-pixel opening 60 corresponding to the transparent light-emitting device.

The driving device layer 4 may include a substrate layer 401, a semiconductor layer 402, a gate insulation layer 403, a gate metal layer 404, an interlayer insulation layer 405, a source/drain metal layer 406 and a planarization layer 407 which are sequentially stacked. An active layer located in the semiconductor layer 402, a gate electrode located in the gate metal layer 404, and the source and drain electrodes in the source/drain metal layer 406 constitute the thin film transistor 41. It should be noted that in other possible embodiments, the thin film transistor may not include the structure in the source/drain metal layer. The thin film transistor 41 is a device for forming a pixel driving circuit. Each of the substrate layer 401, the gate insulation layer 403, the interlayer insulation layer 405, and the planarization layer 407 is a transparent film layer which has less blocking effect on light. Each of the semiconductor layer 402, the gate metal layer 404 and the source/drain metal layer 406 is an opaque structure. In the related art, thin film transistors are distributed at a position where each of the light-emitting devices is located, that is, the thin film transistor is arranged under each sub-pixel opening. As a result, the thin film transistor blocks the light for recognizing the fingerprint, thereby causing adverse effects on fingerprint recognition. In an embodiment of the present disclosure, the thin film transistor 41 does not overlap with the sub-pixel opening of the transparent light-emitting device. For example, as shown in FIG. 6, the red light-emitting device R is a transparent light-emitting device, and the blue light-emitting device B is non-transparent light-emitting device. There is no thin film transistor 41 under the sub-pixel opening 60 corresponding to the red light-emitting device R, and there is a thin film transistor 41 only under the sub-pixel opening 60 corresponding to the blue light-emitting device B. In this way, the anode 50 of the red light-emitting device R is adapted to be set as a transparent electrode, thereby further reducing light blocking by the organic light-emitting display panel. Therefore, the optical fingerprint recognition sensor can receive more light for recognizing the fingerprint, thereby further improving the accuracy of fingerprint recognition.

In an embodiment, as shown in FIG. 6, the thin film transistor 41 overlaps with the sub-pixel opening 60 corresponding to the non-transparent light-emitting device. That is, the thin film transistor 41 is arranged in a space under the non-transparent light-emitting device to form a pixel driving circuit to drive of the light-emitting device 3. For the transparent light-emitting device, for example, the red light-emitting device R in FIG. 6, the pixel driving circuit corresponding thereto can be arranged at its periphery. The space under the other light-emitting devices can also be utilized. Only the pixel driving circuit needs to make the signal line reach the position where the anode 50 corresponding to the transparent light-emitting device is located, so that the anode 50 is electrically connected to the pixel driving circuit via a though hole in the planarization layer 407, as long as the anode 50 of the transparent light-emitting device can receive the voltage signal provided by the pixel driving circuit, and the position of the electrical connection between the anode 50 of the transparent light-emitting device and the pixel driving circuit can also be arranged in a region outside the sub-pixel opening 60.

In an embodiment, as shown in FIG. 6, the driving device layer 4 further includes a metal line 42 that does not overlap with the sub-pixel opening 60 corresponding to the transparent light-emitting device.

The metal line 42 is configured to realize the transmission of signals in the driving pixel circuit, and may be located in the source/drain metal layer 406 or in other metal layers. Since the structure is also an opaque structure, it is also arranged in a region outside the sub-pixel opening 60 corresponding to the transparent light-emitting device to increase the light transmittance of the driving device layer 4 under the transparent light-emitting device, so that the optical fingerprint recognition sensor can receive more light for recognizing the fingerprint. In addition, the pixel driving circuit may include a capacitor in addition to the metal line and the thin film transistor. The capacitor is formed by two metal electrodes, each of which is also an opaque structure. Similar to the arrangement manners of the thin film transistor 41 and the metal line 42, this capacitor can also be arranged to have no overlapping with the sub-pixel opening 60 corresponding to the transparent light-emitting device.

Figure 7:
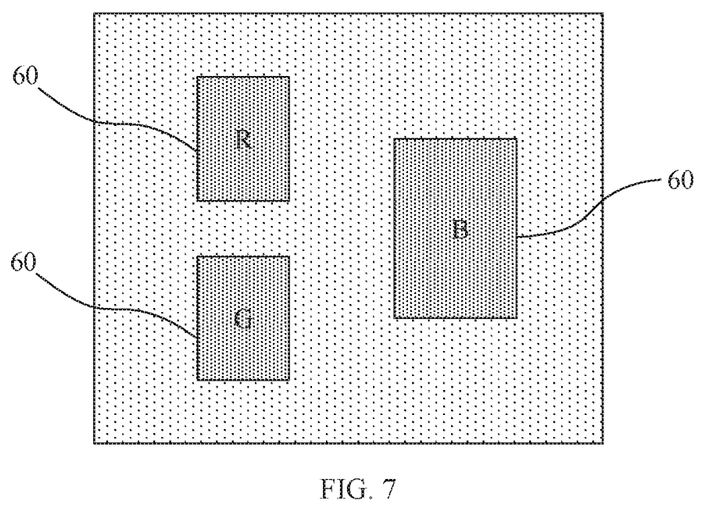
FIG. 7 is a structural schematic diagram showing a part of sub-pixel openings corresponding to FIG. 3.

In an embodiment, as shown in FIGS. 3 and 7, FIG. 7 is a structural schematic diagram showing a part of sub-pixel openings corresponding to FIG. 3. An area of the sub-pixel opening 60 corresponding to each of the non-transparent light-emitting devices is larger than an area of the sub-pixel opening 60 corresponding to each of the transparent light-emitting devices.

In FIGS. 3 and 7, the red light-emitting device R and the green light-emitting device G are transparent light-emitting devices, and the blue light-emitting device is a non-transparent light-emitting device, that is, an area of the sub-pixel opening 60 of each of the blue light-emitting devices B is larger than an area of the sub-pixel openings 60 corresponding to each of the red light-emitting devices R and each of the green light-emitting devices G. On the one hand, the sub-pixel opening 60 corresponding to the blue light-emitting device B is arranged to have a larger area because the light-emitting devices having different colors have different luminous efficiency, which can improve the brightness of the light-emitting device. On the other hand, the thin-film transistor in the pixel driving circuit does not overlap with the sub-pixel opening 60 corresponding to the transparent light-emitting device, but overlaps with the sub-pixel opening 60 corresponding to the non-transparent light-emitting device. That is, no thin film transistors are arranged in the sub-pixel openings 60 corresponding to the red light-emitting device R and the green light-emitting device G, and the thin film transistors are arranged only in the sub-pixel openings 60 corresponding to the blue light-emitting devices B, so that the space occupied by the pixel driving circuit is reduced. Therefore, in an embodiment of the present disclosure, an area of the sub-pixel opening 60 corresponding to the blue light-emitting device B is set to be larger, so that it can be arranged with more thin film transistors therein, and the pixel driving circuit has enough space for arrangement.

In an embodiment, the display region 1 further includes a non-fingerprint-recognition region 12. In the non-fingerprint-recognition region 12, the anode of each of the light-emitting devices is a reflective electrode.

In the non-fingerprint-recognition region 12, since light is not required to pass through the organic light-emitting display panel to realize fingerprint recognition, the anodes of all of the light-emitting devices are arranged as reflective electrodes, so that the brightness of the sub-pixel corresponding to each of the light-emitting devices can be improved, thereby achieving better display effect.

Figure 8:
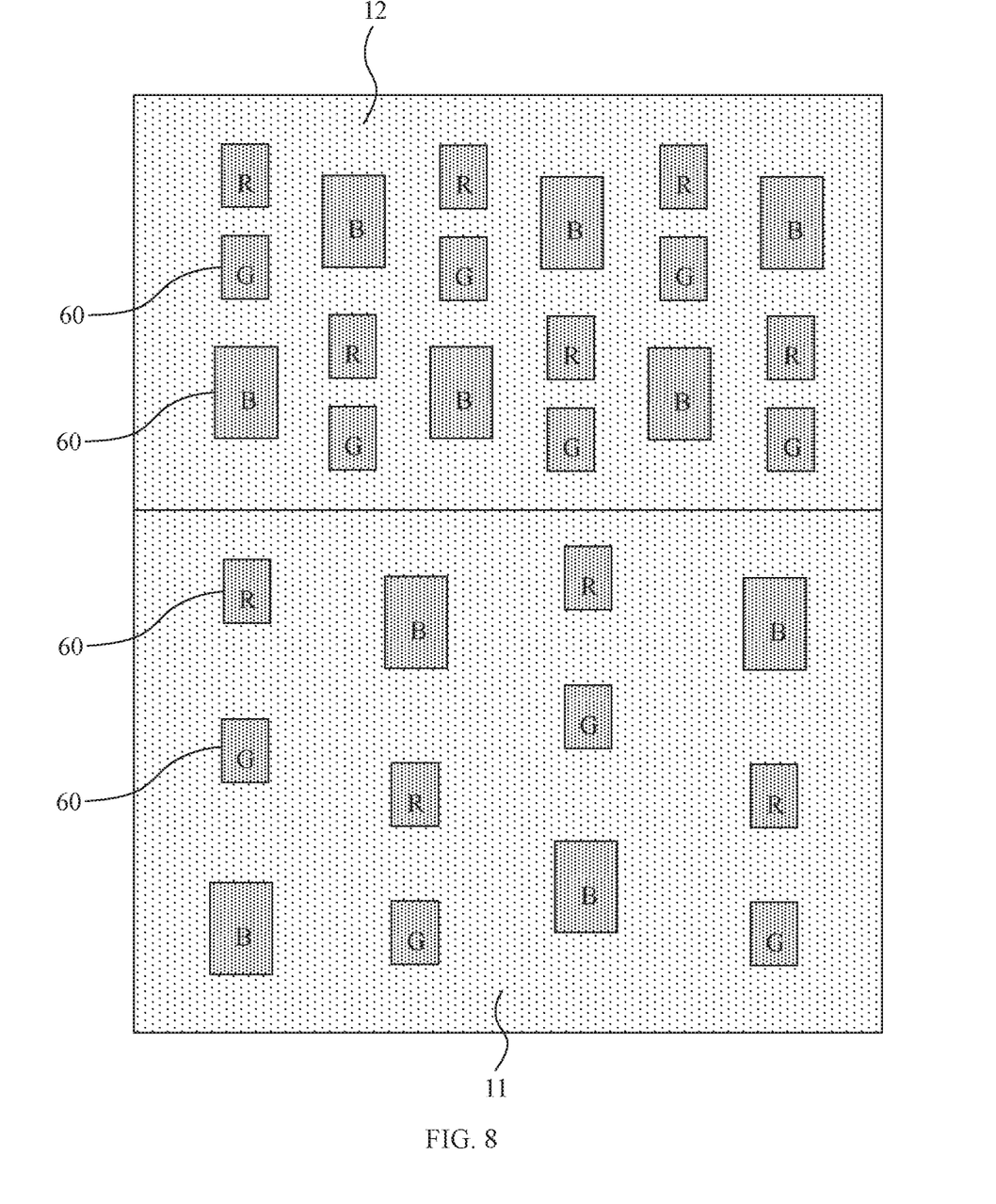
FIG. 8 is a schematic diagram showing a distribution of sub-pixel openings of a portion in FIG. 2.

In an embodiment, as shown in FIG. 8, FIG. 8 is a schematic diagram showing a distribution of sub-pixel openings in a partial region in FIG. 2. The fingerprint recognition region 11 has a smaller resolution than the non-fingerprint-recognition region 12.

Here, the resolution refers to a number of pixel in a unit area, and one pixel is composed of three sub-pixels. Therefore, in the fingerprint recognition region 11, the resolution is low, that is, the number of sub-pixels per unit area is less. In the non-fingerprint-recognition region 12, the resolution is high, and the number of sub-pixels per unit area is greater. Each sub-pixel corresponds to one sub-pixel opening 60. In the fingerprint recognition region 11, since there is no thin film transistor in the sub-pixel opening 60, the space occupied by the pixel driving circuit is reduced. If the number of sub-pixels per unit area is large, there may not be sufficient space for the pixel driving circuit. Therefore, in an embodiment of the present disclosure, the number of sub-pixels per unit area is relatively small in the fingerprint recognition region 11. Therefore, outside the sub-pixel opening 60 corresponding to the transparent light-emitting device, there is still enough space to arrange the pixel driving circuit. In the non-fingerprint-recognition region 12, since the fingerprint recognition function is not required, but only the normal image display is required, the thin film transistor can be arranged in each sub-pixel opening 60 corresponding to the light-emitting device. Therefore, the space for arranging the pixel driving circuit may be large, and a higher resolution can be set to improve the display effect.

In an embodiment, the transparent electrode is made of an indium tin oxide material or an indium zinc oxide material.

The transparent electrode may be made of an indium tin oxide material or an indium zinc oxide material. On the one hand, a high light transmittance can be ensured, and on the other hand, a good electrical conductivity can be ensured to realize function of an electrode in an organic light-emitting diode.

Figure 9:
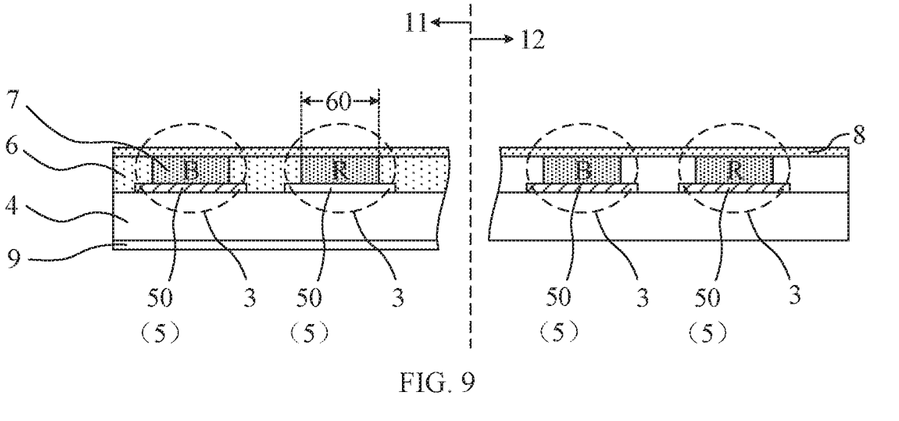
FIG. 9 is a cross-sectional structural schematic diagram showing a portion of the fingerprint recognition region and a portion of the non-fingerprint-recognition region in FIG. 2.

In an embodiment, FIG. 9 is a cross-sectional structural schematic diagram showing a portion of the fingerprint recognition region and a portion of the non-fingerprint-recognition region in FIG. 2. The display region 1 further includes a non-fingerprint-recognition region 12. In the non-fingerprint-recognition region 12, the anode 50 of each of the light-emitting devices 3 is a reflective electrode. Any transparent light-emitting device is a first light-emitting device. The light-emitting device having the same color as the transparent light-emitting device in the non-fingerprint-recognition region 12 is a second light-emitting device. When the brightness of the first light-emitting device is the same as the brightness of the second light-emitting device, a value of a driving current of the first light-emitting device is not equal to a value of a driving current of the second light-emitting device.

For example, the red light-emitting device R located in the fingerprint recognition region 11 shown in FIG. 9 is the first light-emitting device, and the red light-emitting device R in the non-fingerprint-recognition region 12 is the second light-emitting device. When the brightness of the above two is identical, since the anode 50 of the first light-emitting device is a transparent electrode, the light generated by the organic light-emitting layer 7 of the first light-emitting device directly exits downward at the anode 50 with a loss. Since the anode 50 of the second light-emitting device is a reflective electrode, therefore, the light generated by the organic light-emitting layer 7 of the second light-emitting device is reflected upward at the anode 50 and can still be emitted from the cathode layer 8. Therefore, when the brightness of the above two light-emitting devices is identical, different driving current values are required, and the driving current value is correlated to the brightness of the specific light-emitting device. That is, when the first light-emitting device and the second light-emitting device are driven, it is useful to change the magnitude of the driving current, thereby compensating for the brightness loss caused by setting the anode of the transparent light-emitting device as a transparent electrode.

Figure 10:
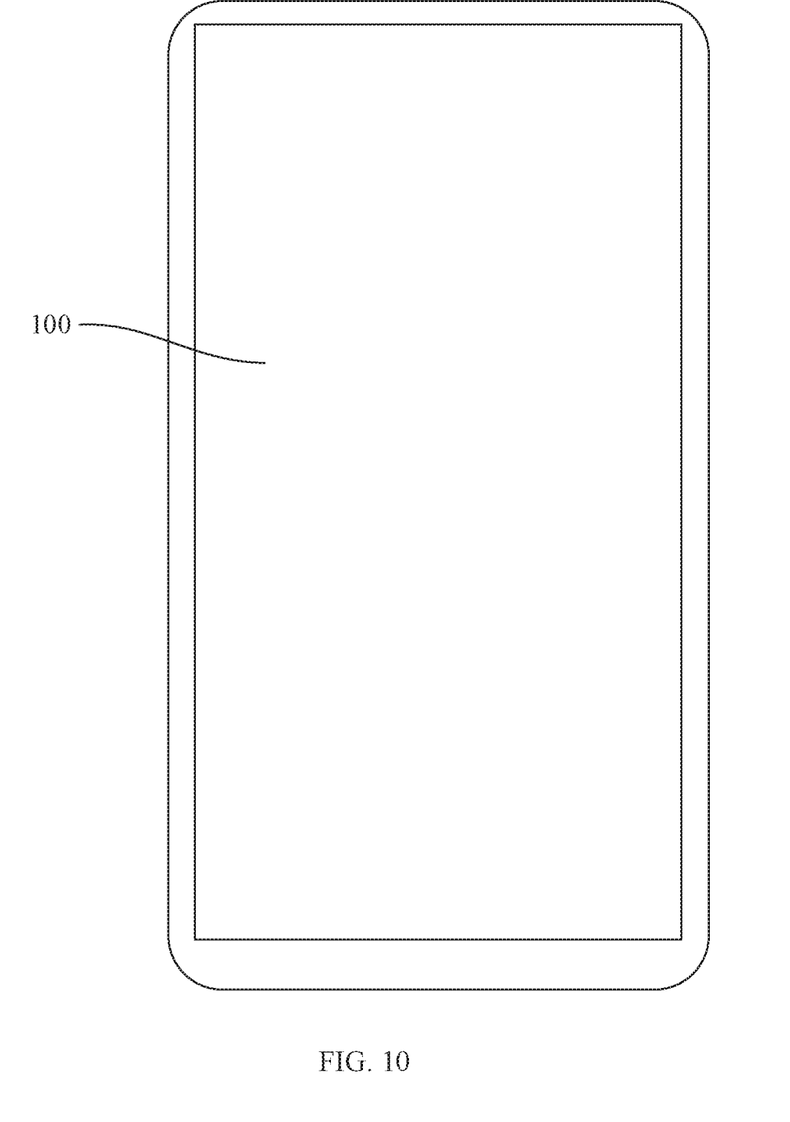
FIG. 10 is a structural schematic diagram showing a display apparatus according to an embodiment of the present disclosure.

As shown in FIG. 10, FIG. 10 is a structural schematic diagram showing a display apparatus according to an embodiment of the present disclosure. The present disclosure further provides a display apparatus including the organic light-emitting display panel 100 described above.

The specific structure of the display panel 100 is the same as that of the foregoing embodiment, and details are not elaborated here. The display apparatus may be any electronic apparatus having a display function such as a mobile phone, a tablet computer, a laptop computer, an electronic paper book, or a television.

In the organic light-emitting display panel according to the embodiments of the disclosure, the optical fingerprint recognition sensor is arranged in the fingerprint recognition region of the display region, while the anodes of at least a part of the light-emitting devices in the fingerprint recognition region are set as transparent electrodes. As a result, the light used for recognizing the fingerprint can be transmitted to the optical fingerprint recognition sensor, thereby realizing the fingerprint recognition function in the display region, which facilitates the design of the narrow border. Compared with the anodes of all the light-emitting device being the reflective electrodes shown in the related art, when the fingerprint recognition function of the display region of the inventive technology is realized, the optical fingerprint recognition sensor can receive more light for recognizing the fingerprint, and therefore, the accuracy of fingerprint recognition is higher.

The above are merely preferred embodiments of the present disclosure, which, as mentioned above, are not used to limit the present disclosure. Within the principles of the present disclosure, any modification, equivalent substitution, improvement, etc., shall fall into the protection scope of the present disclosure.

Finally, it should be noted that the above embodiments are merely illustrative of the technical solutions of the present disclosure, and are not intended to limit thereto. Although the present disclosure has been described in detail with reference to the foregoing embodiments, those skilled in the art can understand that the present disclosure is not limited to the specific embodiments described herein, and can make various obvious changes, re-adjustments, and substitutions without departing from the scope of the present disclosure.

What is claimed is:

1. An organic light-emitting display panel, the organic light-emitting display panel having a display region, the display region comprising a fingerprint recognition region and a plurality of light-emitting devices for displaying an image, the organic light-emitting display panel comprising:
    a driving device layer, an anode layer, a pixel definition layer, an organic light-emitting layer, and a cathode layer, all of which are sequentially stacked; and
    an optical fingerprint recognition sensor located in the fingerprint recognition region and located at a side of the driving device layer facing away from the anode layer;
    wherein the pixel definition layer comprises a plurality of sub-pixel openings corresponding to the plurality of light-emitting devices, each of the plurality of light-emitting device comprising an anode corresponding to one of the plurality of sub-pixel openings, the anode being located in the anode layer and overlapping with a corresponding one of the plurality of sub-pixel openings, the organic light-emitting layer being located in each of the plurality of sub-pixel openings, and the cathode layer overlapping with each of the plurality of sub-pixel openings;
    in the fingerprint recognition region, at least a portion of the plurality of light-emitting devices each having an anode that is a transparent electrode,
    in the fingerprint recognition region, the plurality of light-emitting devices comprises a red light-emitting device, a green light-emitting device, and a blue light-emitting device, and each or one of the red light-emitting device and the green light-emitting device is a transparent light-emitting device having an anode that is a transparent electrode, the blue light-emitting device being a non-transparent light-emitting device having an anode that is a reflective electrode.

2. The organic light-emitting display panel according to claim 1, wherein
the driving device layer comprises a thin film transistor; and
in a direction perpendicular to a plane where the organic light-emitting display panel is located, the thin film transistor does not overlap with one of the plurality of sub-pixel openings corresponding to the transparent light-emitting device.

3. The organic light-emitting display panel according to claim 2, wherein
the thin film transistor overlaps with one of the plurality of sub-pixel openings corresponding to the non-transparent light-emitting device.

4. The organic light-emitting display panel according to claim 2, wherein
the driving device layer further comprises a metal line that does not overlap with one of the plurality of sub-pixel openings corresponding to the transparent light-emitting device.

5. The organic light-emitting display panel according to claim 2, wherein
an area of one of the plurality of sub-pixel openings corresponding to the non-transparent light-emitting device is larger than an area of one of the plurality of sub-pixel openings corresponding to the transparent light-emitting device.

6. The organic light-emitting display panel according to claim 2, wherein
the display region further comprises a non-fingerprint-recognition region, and in the non-fingerprint-recognition region, each of the plurality of light-emitting devices has an anode that is a reflective electrode.

7. The organic light-emitting display panel according to claim 6, wherein
a resolution of the fingerprint recognition region is smaller than a resolution of the non-fingerprint-recognition region.

8. The organic light-emitting display panel according to claim 1, wherein
the transparent electrode is made of an indium tin oxide material or an indium zinc oxide material.

9. The organic light-emitting display panel according to claim 1, wherein
the display region further comprises a non-fingerprint-recognition region, and wherein in the non-fingerprint-recognition region, each of the plurality of light-emitting devices has an anode that is a reflective electrode; and
wherein the transparent light-emitting device is a first light-emitting device, and in the non-fingerprint-recognition region, one of the plurality of light-emitting devices having a same color as the transparent light-emitting device is a second light-emitting device, and wherein when a brightness of the first light-emitting device is identical to a brightness of the second light-emitting device, a value of a driving current of the first light-emitting device is not identical to a value of a driving current of the second light-emitting device.

10. A display apparatus, comprising an organic light-emitting display panel, wherein the organic light-emitting display panel has a display region, the display region comprising a fingerprint recognition region and a plurality of light-emitting devices for displaying an image, the organic light-emitting display panel comprises:
a driving device layer, an anode layer, a pixel definition layer, an organic light-emitting layer, and a cathode layer, all of which are sequentially stacked; and
an optical fingerprint recognition sensor located in the fingerprint recognition region and located at a side of the driving device layer facing away from the anode layer;
wherein the pixel definition layer comprises a plurality of sub-pixel openings corresponding to the plurality of light-emitting devices, each of the plurality of light-emitting device comprising an anode corresponding to one of the plurality of sub-pixel openings, the anode being located in the anode layer and overlapping with a corresponding one of the plurality of sub-pixel openings, the organic light-emitting layer being located in each of the plurality of sub-pixel openings, and the cathode layer overlapping with each of the plurality of sub-pixel openings;
in the fingerprint recognition region, at least a portion of the plurality of light-emitting devices each having an anode that is a transparent electrode,
in the fingerprint recognition region, the plurality of light-emitting devices comprises a red light-emitting device, a green light-emitting device, and a blue light-emitting device, and
each or one of the red light-emitting device and the green light-emitting device is a transparent light-emitting device having an anode that is a transparent electrode, the blue light-emitting device being a non-transparent light-emitting device having an anode that is a reflective electrode.

11. The display apparatus according to claim 10, wherein
the driving device layer comprises a thin film transistor; and
in a direction perpendicular to a plane where the organic light-emitting display panel is located, the thin film transistor does not overlap with one of the plurality of sub-pixel openings corresponding to the transparent light-emitting device.

12. The display apparatus according to claim 11, wherein
the thin film transistor overlaps with one of the plurality of sub-pixel openings corresponding to the non-transparent light-emitting device.

13. The display apparatus according to claim 11, wherein
the driving device layer further comprises a metal line that does not overlap with one of the plurality of sub-pixel openings corresponding to the transparent light-emitting device.

14. The display apparatus according to claim 11, wherein
an area of one of the plurality of sub-pixel openings corresponding to the non-transparent light-emitting device is larger than an area of one of the plurality of sub-pixel openings corresponding to the transparent light-emitting device.

15. The display apparatus according to claim 11, wherein
the display region further comprises a non-fingerprint-recognition region, and in the non-fingerprint-recognition region, each of the plurality of light-emitting devices has an anode that is a reflective electrode.

16. The display apparatus according to claim 15, wherein
a resolution of the fingerprint recognition region is smaller than a resolution of the non-fingerprint-recognition region.

17. The display apparatus according to claim 10, wherein the transparent electrode is made of an indium tin oxide material or an indium zinc oxide material.

18. The display apparatus according to claim 10, wherein the display region further comprises a non-fingerprint-recognition region, and wherein in the non-fingerprint-recognition region, each of the plurality of light-emitting devices has an anode that is a reflective electrode; and wherein the transparent light-emitting device is a first light-emitting device, and in the non-fingerprint-recognition region, one of the plurality of light-emitting devices having a same color as the transparent light-emitting device is a second light-emitting device, and wherein when a brightness of the first light-emitting device is identical to a brightness of the second light-emitting device, a value of a driving current of the first light-emitting device is not identical to a value of a driving current of the second light-emitting device.

* * * * *